United States Patent
Hannah et al.

(10) Patent No.: US 7,112,354 B2
(45) Date of Patent: Sep. 26, 2006

(54) ELECTRON SPIN MECHANISMS FOR INDUCING MAGNETIC-POLARIZATION REVERSAL

(75) Inventors: Eric C. Hannah, Pebble Beach, CA (US); Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/051,311

(22) Filed: Feb. 3, 2005

(65) Prior Publication Data

US 2005/0135151 A1    Jun. 23, 2005

Related U.S. Application Data

(62) Division of application No. 10/717,954, filed on Nov. 19, 2003, now Pat. No. 6,870,762.

(51) Int. Cl.
*B29C 35/08* (2006.01)

(52) U.S. Cl. ............... 427/599; 427/548; 427/551; 427/571; 427/502; 427/128; 365/173; 365/171; 365/158; 365/97; 365/66; 365/48

(58) Field of Classification Search ............... 365/173, 365/171, 158, 97, 66, 48; 427/502, 548, 427/551, 571, 599, 128
See application file for complete search history.

(56) References Cited

U.S. PATENT DOCUMENTS

| | | | | |
|---|---|---|---|---|
| 4,766,512 A | * | 8/1988 | Bogdanski | 360/137 |
| 5,225,024 A | * | 7/1993 | Hanley et al. | 156/345.46 |
| 5,232,569 A | * | 8/1993 | Nelson et al. | 204/192.15 |
| 5,268,235 A | * | 12/1993 | Lashmore et al. | 428/610 |
| 5,320,719 A | * | 6/1994 | Lasbmore et al. | 205/104 |
| 5,352,899 A | * | 10/1994 | Golovanivsky et al. | 250/492.21 |
| 5,625,195 A | | 4/1997 | Grouillet | 250/492.21 |
| 5,695,864 A | | 12/1997 | Slonczewski | 428/212 |
| 6,078,468 A | | 6/2000 | Fiske | 360/97.01 |
| 6,223,866 B1 | * | 5/2001 | Giacomazza | 188/73.38 |
| 6,574,026 B1 | * | 6/2003 | Jin et al. | 359/224 |
| 6,621,100 B1 | * | 9/2003 | Epstein et al. | 257/40 |
| 6,660,375 B1 | * | 12/2003 | Miller et al. | 428/336 |
| 6,741,496 B1 | * | 5/2004 | Hannah et al. | 365/173 |
| 6,794,272 B1 | * | 9/2004 | Turner et al. | 438/459 |
| 6,918,965 B1 | * | 7/2005 | Tuttle et al. | 148/108 |
| 2005/0260331 A1 | * | 11/2005 | Wang et al. | 427/2.1 |

* cited by examiner

*Primary Examiner*—Viet Q. Nguyen
(74) *Attorney, Agent, or Firm*—Paul E. Steiner

(57) ABSTRACT

An apparatus includes a low magnetic-coercivity layer of material (LMC layer) having a majority electron-spin-polarization (M-ESP), an energy-gap coupled with the LMC layer, wherein a flow of spin-polarized electrons having an electron-spin-polarization anti-parallel to the LMC layer are injected via the energy-gap, to change the M-ESP of the LMC layer. A non-magnetic material is in electrical communication with the LMC layer and provides a spin-balanced source of current to the LMC layer, responsive to the injection of spin-polarized electrons into the LMC layer.

31 Claims, 12 Drawing Sheets

FIGURE 4

402 — CRITICAL EQUATION FOR REVERSAL OF THE SPIN POLARIZATION OF THE MAGNETIC VOLUME $$\frac{N_s}{\tau_s} < \frac{I}{e} \cdot g$$

404 — $N_s$ = NUMBER OF SPINS IN A MAGNETIC VOLUME

406 — $\tau_s$ = SPIN RELAXATION TIME

408 — $I$ = ELECTRON CURRENT

410 — $e$ = ELECTRON UNIT CHARGE

412 — $g$ = NUMBER OF $e_2$ POLARIZED ELECTRONS EJECTED PER INJECTED $e_1$ POLARIZED ELECTRON

ELECTRON SPIN MECHANISMS FOR INDUCING MAGNETIC-POLARIZATION REVERSAL

The present patent application is a Divisional of application Ser. No. 10/717,954, filed Nov. 19, 2003 now U.S. Pat. No. 6,870,762.

BACKGROUND OF THE INVENTION

1. Field of Invention

This invention relates generally to magnetic-polarization control and more specifically to magnetic memory systems enhanced through the control of spin-polarized electrons.

2. Art Background

Present transistor-capacitor based metal oxide semiconductor (MOS) and complimentary metal oxide semiconductor (CMOS) non-volatile memory technologies are approaching practical memory density limits as the lithography and material processes have been scaled down to smaller geometries. The oxide thickness of flash memory cells cannot be made much thinner with existing materials without allowing the undesirable condition of hot electron tunneling to occur. Thus, a practical memory density limit is approaching for traditional transistor based non-volatile memory devices.

Electron spin based devices are being used as memory cells for the storage of data. For example, magnetic random access memory (MRAM) offers the possibility of replacing flash memory technology with a lower voltage, scalable technology. The spins of electrons are tied to magnetism, as in the ensemble of spins in a memory cell or quantum well device.

Presently constructed MRAM uses giant magneto-resistance (GMR) or magnetic tunnel junctions (MTJ) to control the sense/tunneling currents. These devices manipulate the magnetic state of the memory cell by using the coupling of strong magnetic fields induced by currents in conductors that are proximate with and magnetically coupled to the magnetic memory cell. Randomly polarized electrons conducted through these conductors are used to induce a strong magnetic field that causes reversing of opposing magnetic domains. This process requires a very high current density and dissipates large amounts of energy, hence it is inefficient and inconsistent with the requirements of scalable, low power memory.

The basic GMR memory cell uses a three-layer composite consisting of a weaker magnetic layer/non-magnetic conductor layer/stronger reference magnetic layer. The change in impedance across the cell varies between the two memory states corresponding to the alignment of the magnetic-polarizations of the two magnetic layers being aligned or anti-aligned. A larger impedance change between the aligned and anti-aligned states corresponds to a greater detectable signal level. Therefore, magnetic memory cells could be made smaller if the impedance change could be increased.

What is needed is a memory device that permits its magnetic-polarization to be changed using less power while providing a greater detectable signal. What is also needed is a magnetic memory device that is configurable in higher memory densities than are presently achievable with conventional flash memory architecture or present-MRAM memory cells.

BRIEF DESCRIPTION OF THE DRAWINGS

The present invention is illustrated by way of example and is not limited in the figures of the accompanying drawings, in which like references indicate similar elements.

FIG. 4 is a critical equation governing reversal of an electron-spin polarization within a magnetic volume.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the invention is defined only by the appended claims.

Figure 1:
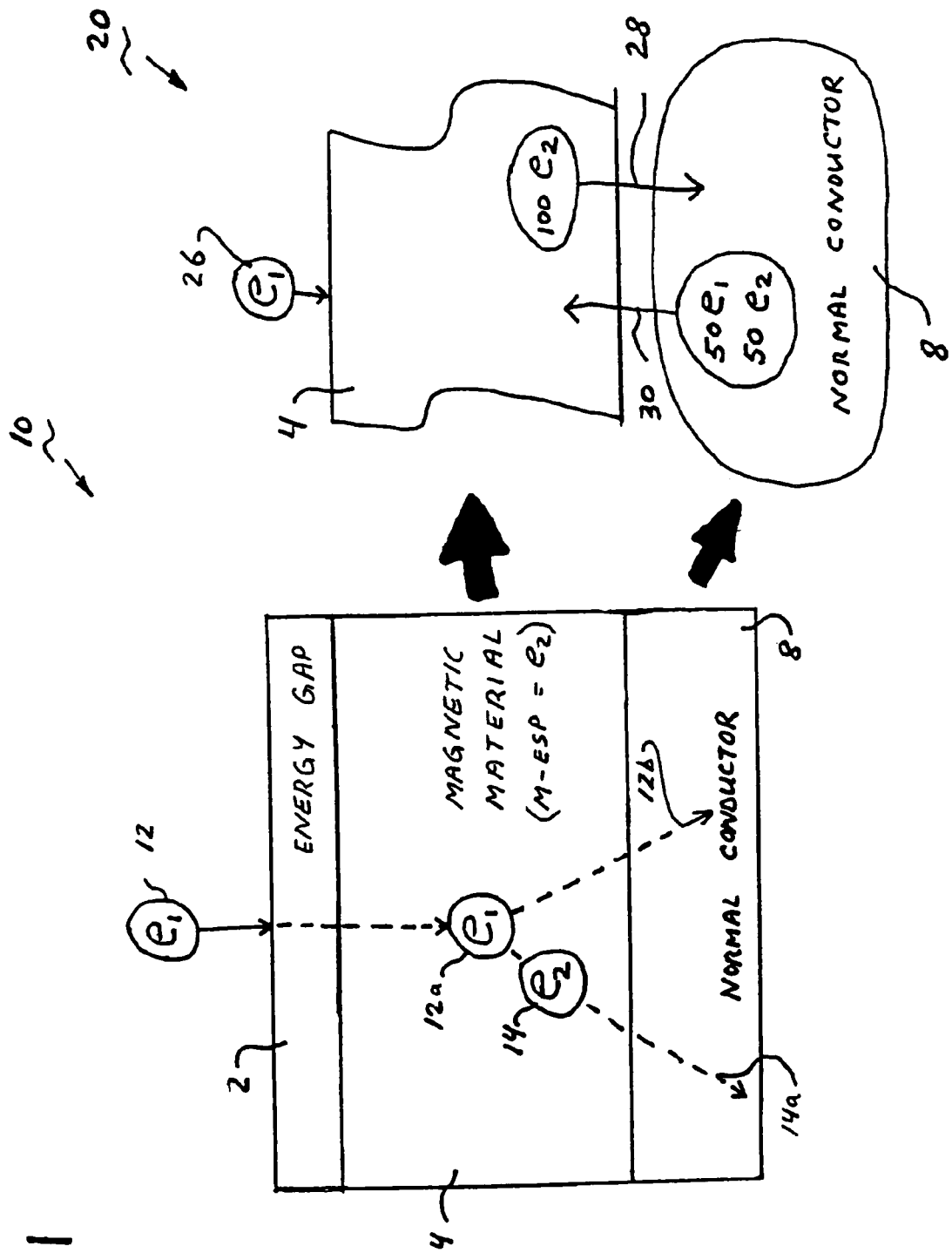
FIG. 1 illustrates magnetic polarization reversal within a magnetic material.

A low power method and apparatus for reversing a majority electron-spin-polarization (M-ESP) of a magnetic material is disclosed. In one embodiment of the present invention, magnetic polarization reversal within a magnetic material is illustrated in FIG. 1 at 10. With reference to FIG. 1, a magnetic material 4 will undergo reversal of its M-ESP subsequent to injection of a flow of spin-polarized (SP) electrons whose electron-spin-polarization (ESP) is anti-parallel to the M-ESP of the magnetic material 4.

A magnetic material's magnetic polarization may be described as being either parallel to e1 or e2. e1 and e2 are electron spin polarizations which will be described below in conjunction with FIG. 1B. The magnetic material 4 will be arbitrarily assigned a M-ESP of e2. A typical magnetic material for use in this application is permalloy or nickel-cobalt-iron.

A normal conductor 8 is coupled with the magnetic material 4 as shown in FIG. 1. The normal conductor can be a metal such as copper, or any other combination of materials that provide a spin-balanced current (equal numbers of e1 and e2 electrons described below in conjunction with FIG. 1B) in a low work function material. Additionally, a normal conductor exhibits conductive behavior at 300 degrees Centigrade.

An energy-gap 2 is coupled with the magnetic material 4. In one embodiment of the present invention, the energy-gap 2 may be a tunnel junction layer of material (a tunnel junction is describe more fully below in conjunction with FIG. 5). A typical tunnel junction can be a layer of an oxide such as aluminum oxide or titanium oxide. A typical thickness of a tunnel junction layer is between one and twenty angstroms (nM). In an alternative embodiment of the present invention, the energy-gap 4 can be constructed with two magnetic-mirrors separated by a normal conductor. In one embodiment, a magnetic-mirror can be a half-metallic layer of material such as chromium dioxide. Magnetic mirrors and half-metallic material will be described below in conjunction with FIGS. 6–8. The energy-gap 4 has the property of an electrical insulator and performs the function of magnetically decoupling magnetic materials in contact with adjacent sides of the energy-gap. Electrons may be injected across or via an energy-gap without dissipation of energy from resistance. Thus, the energy-gap provides a resistance free barrier by which high-energy electrons 12 may be injected into the magnetic material.

Figure 2:
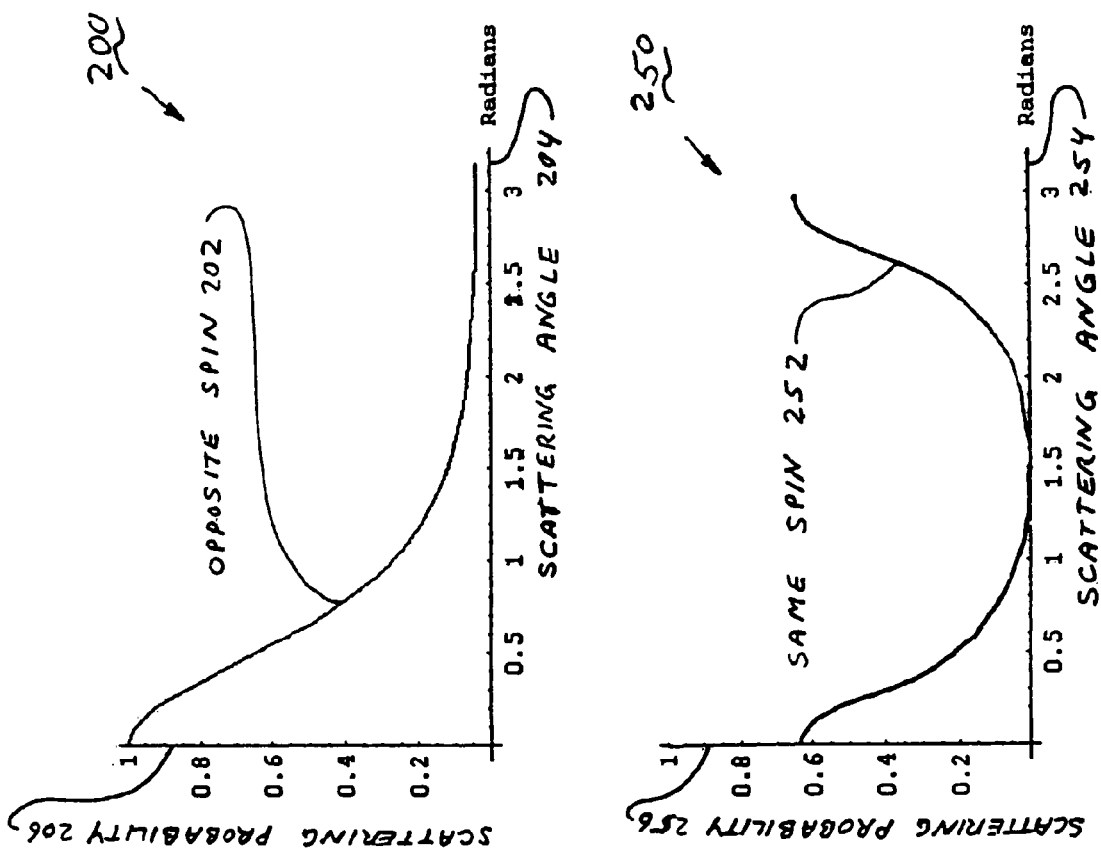
FIG. 2 is a plot of scattering probability for opposite and same spin electrons as a function of included scattering angle.

For the purpose of this example, since the M-ESP of the magnetic material 4 was arbitrarily assigned the value of e2, the spin-polarization of the injected high-energy electrons must be of opposite spin-polarity to ensure preferential collisions with majority spin electrons 14 consistent with the Pauli Exclusion Principle (described below in conjunction with FIG. 2). The injected high-energy e1-SP electrons 12a collide with electrons of opposite ESP 14, in this example e2-SP due to the M-ESP of the material being chosen as e2.

Several mechanisms for achieving magnetic gain are taught according to various embodiments of the present invention. Magnetic gain is useful for reversing the polarization state of the magnetic material 4. As was previously mentioned, the present invention teaches low power methods for reversing the magnetic polarization state of a magnetic material. Thus, magnetic-gain reduces the required power necessary for polarization reversal, and will be described more fully below in conjunction with FIGS. 4–8B.

With reference to FIG. 1, magnetic gain is illustrated at 20. An injected high-energy e1-SP electron at 26 interacts With a plurality of e2-SP electrons in magnetic material 4, which are at an energy level approximately equal to thermal energy, exciting or scattering approximately one hundred (100) e2-SP electrons as shown at 28. The gain associated with one high-energy e1-SP electron 26 causing one hundred (100) e2-SP electrons to leave material 4 is described more fully below in conjunction with FIG. 5. As just described, e2-SP electrons 28 are excited or scattered and are driven out of the magnetic material 4 (as described below in conjunction with FIG. 3) interacting with normal conductor 8 to provide a source of magnetic gain as illustrated in 20 in FIG. 1. As e2-SP electrons leave the magnetic material 4 passing through the normal conductor 8, an induced electrostatic potential arises that causes a spin-balanced current to flow back into the magnetic material 4 supplying approximately fifty (50) e1-SP electrons 30 for each injected e1-SP electron 26. Additionally, magnetic gain can be achieved by creating a magnetic-mirror. A magnetic-mirror allows electrons with an ESP parallel to the ESP of the mirror to pass through the mirror but causes electrons with an ESP anti-parallel to the mirror to accumulate and interact with the magnetic material, thereby furthering the reversal of the M-ESP of the magnetic material. In one embodiment, a magnetic-mirror can be a half-metallic layer of material such as chromium dioxide. Use of a magnetic-mirror is described more fully below in conjunction with FIGS. 6–8. Thus, magnetic gain is achieved with the present invention according to several different mechanisms.

As the population of e1-SP electrons grows to the detriment of the e2-SP electrons the M-ESP of the material is overwhelmed and is reversed by the present invention. Magnetic gain serves to decrease the required power consistent with the requirement of overcoming thermal relaxation within the material as described more fully in conjunction with FIG. 4 below. Thermal relaxation requires the reversal of the M-ESP of the material to be achieved within approximately 1 nanosecond (ns) for the example of Iron (Fe) described in FIG. 4.

An application of the present invention is taught, in one embodiment, to a magnetic memory cell that is capable of being operated between two logic states. The logic states correspond to two different majority electron-spin-polarizations of electrons within a magnetic storage layer of low magnetic-coercivity (LMC) material. LMC material is used for the storage layer so that the M-ESP of the storage layer may be reversed without affecting the M-ESP of the reference layer of the memory cell. A typical material to use for making the storage layer is permaloy. The magnetic memory cell uses a reference layer of high magnetic-coercivity (HMC) material that does-not change M-ESP. A typical material to use for making the reference layer is alnico. However, it will be noted by those skilled in the art that the same type of material may be used for both the LMC and the HMC layer, such as nickel-cobalt or nickel-cobalt-iron. It is generally desirable to use a system of materials with similar atomic spacing so that a row of atoms is not pressed out of existence by dissimilar atomic spacing which can create gaps and undesirable leakage paths in the atomic lattice.

A logic state of the memory cell is sensed by measuring the combined impedance of the reference magnetic layer, the insulation layer, and the storage magnetic layer. The impedance of the cell changes when the storage layer's M-ESP changes relative to the fixed state of the reference layer, thus describing two memory states. In one embodiment of the present invention, the M-ESP of the storage magnetic layer is changed by injecting electrons of opposite electron-spin-polarization (ESP) into the storage layer through an energy-gap which may be a tunnel junction layer or a normal conductor disposed between two magnetic-mirrors. Injecting high-energy SP electrons through an energy-gap allows electrons to be injected at high-energy and low current, which accomplishes reversal of the magnetic polarization according to the teachings of the present invention.

Reversal of the magnetic polarity of a magnetic material, i.e., the M-ESP, according to the embodiments of the present invention, begins with a combination of material selected and built to achieve the particular magnetic properties previously described in conjunction with FIG. 1. Magnetic properties of materials are described with reference to the spin-polarization of electrons contained within the material.

Several ways of describing the spin-polarization of an electron have been used by those skilled in the art, such as spin-up and spin-down. Electron spin is described by a quantum number m and takes on values of $-\frac{1}{2}$ and $+\frac{1}{2}$, corresponding to the two unique directions of spin an electron may assume. The electron can line up parallel (spin-up) or anti-parallel (spin-down) to an atom's magnetic field. The electron's spin makes it act as a tiny magnet. The terms spin-up and spin-down also correspond to clockwise or counterclockwise rotation. To simplify nomenclature herein the term spin-up will correspond to the symbol e1 and the term spin-down will correspond to the symbol e2. Technically, the spin direction is referenced to an arbitrarily defined coordinate system, where a positive direction on the wavenumber axis 106, used in FIG. 1B, corresponds to clockwise rotation and the negative direction on the wavenumber axis 106 corresponds to counterclockwise rotation. An alternate description of the definition (reversing the association of counterclockwise and clockwise with the wavenumber axis) would be equivalent. The labels used to describe the property i.e., "spin-up" and "spin-down" are not limiting to the present invention. What is important is that there are two polarizations of electrons that may be used to manipulate the magnetic state of a layer of material.

Figure 1B:
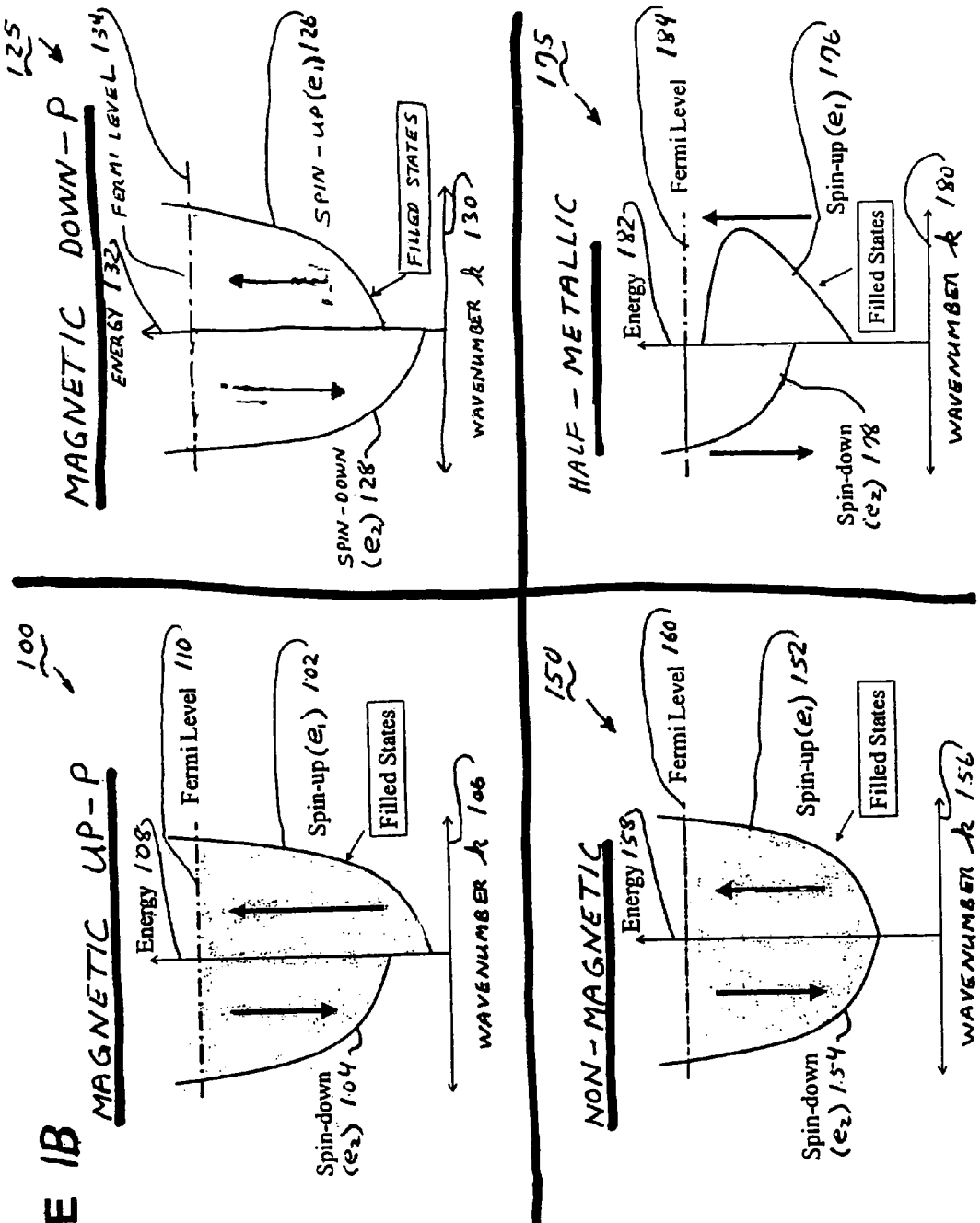
FIG. 1B illustrates an energy distribution as a function of wavenumber for magnetic materials of opposite polarity, a non-magnetic material, and a half-metallic material.

With reference to FIG. 1B, the energy distribution of a magnetic material is shown at 100. Energy level 108 is plotted as a function of wavenumber 106. The material represented by 100 has electrons spinning in polarization e1 with energy distribution 102 and in polarization e2 with energy distribution 104. The exchange energy lowers the energy of the electrons with the majority spin direction in a magnetic metal. The exchange energy is about two (2) electron volts (eV) in typical magnetic metals. The exchange energy creates a split band model. The overall magnetization of the metal with a split band is in the direction of the majority of the spins. The magnetic material 100 is dominated by electrons with a M-ESP of e1. A magnetic material has both energy distributions 104 and 102 at Fermi level 110 as shown in 100. An electron current may be drawn from a magnetic material, which will be dominated by electrons with the majority spin polarization of the magnetic material.

A magnetic material of opposite polarization is shown at 125. Energy distribution 132 is plotted against wavenumber 130. An energy distribution 126 for e1 electrons and an energy distribution 128 for e2 electrons is illustrated in 125. The magnetic material 125 has an M-ESP of e2.

An-energy distribution for a non-magnetic metal may be modeled as shown at 150. The electrons fill up the bands to a highest energy level called the Fermi level. Since there are equal numbers of e1 and e2 spin-polarized (SP) electrons this metal is non-magnetic. Current flowing from a non-magnetic metal will have equal numbers of e1-SP and e2-SP electrons and will be referred to as a spin-balanced current of electrons in a subsequent discussion.

An energy distribution of a magnetic-mirror is shown at 175, with energy level 182 plotted against wavenumber 180. The e2-SP electron energy distribution 178 reaches a Fermi level 184. However an e1-SP electron's energy distribution at 176 does not reach the Fermi level 184. This condition within the magnetic-mirror, illustrated at 175, causes e1-SP electrons to be reflected, while e2-SP electrons may penetrate the magnetic-mirror since the energy levels for the e2-SP electrons reach the Fermi level 184. The magnetic-mirror acts as a mirror to minority-spin electrons. The strength of the magnetic-mirror depends on the particular configuration. In one embodiment, a half-metallic will function as a magnetic-mirror.

A half-metallic material contains a very high magnetic polarization. Typically, a half-metallic material exhibits magnetic polarization in excess of 90%. Therefore, a half-metallic, polarized as shown in 175, would allow e2-SP electrons to pass through it, while stalling and accumulating e1-SP electrons (minority spin electrons). The present invention exploits this property of half-metallics to achieve reversal of the M-ESP of a magnetic layer magnetically coupled to the half-metallic layer. A value of 0.7 electron volt (eV) is typically needed to overcome a half-metallic's gap potential by electrons of opposite ESP (minority spin electrons).

Spin-Polarized Scattering Probabilities and Mean Free Path

Electrons having an electron-spin-polarization (ESP) anti-parallel to the majority electron-spin-polarization (M-ESP) of the magnetic material are chosen for injection because of the preferred scattering that occurs due to the anti-parallel condition. A probability of scattering between two electrons depends on both electron's spin polarizations i.e., e1-ESP and e2-ESP. FIG. 2 is a plot of a scattering probability for opposite and same spin electrons as a function of included scattering angle. With reference to FIG. 2, 200 shows the scattering probability distribution 202 as a function of scattering angle for two electrons colliding with opposite spin, i.e., one electron has e1 spin-polarization and the other has e2 spin-polarization. Scattering probability 206 is plotted as a function of the angle formed by the trajectories of the electrons before collision.

A scattering probability distribution 252 is plotted in 250 for electrons having the same spin polarizations (i.e., e1&e1 or e2&e2). Here, as in 200, scattering probability 256 is plotted as a function of the angle formed by the trajectories of the electrons before collision. Two same spin electrons approaching each other at 1.5 radians (approx. 90 degrees) have a zero probability of scattering (colliding) according to 252. An integration of the scattering probability distributions 202 and 252 across scattering angle show that the scattering probability of opposite spin electrons colliding is greater than same spin electrons colliding. Thus, opposite spin electrons will collide more readily than same spin electrons. This behavior of electron scattering results from the Pauli Exclusion Principle and will be used to exploit reversing or spin-flipping a magnetic-polarization state of a data storage layer in a memory device, as described in the upcoming sections.

Figure 3:
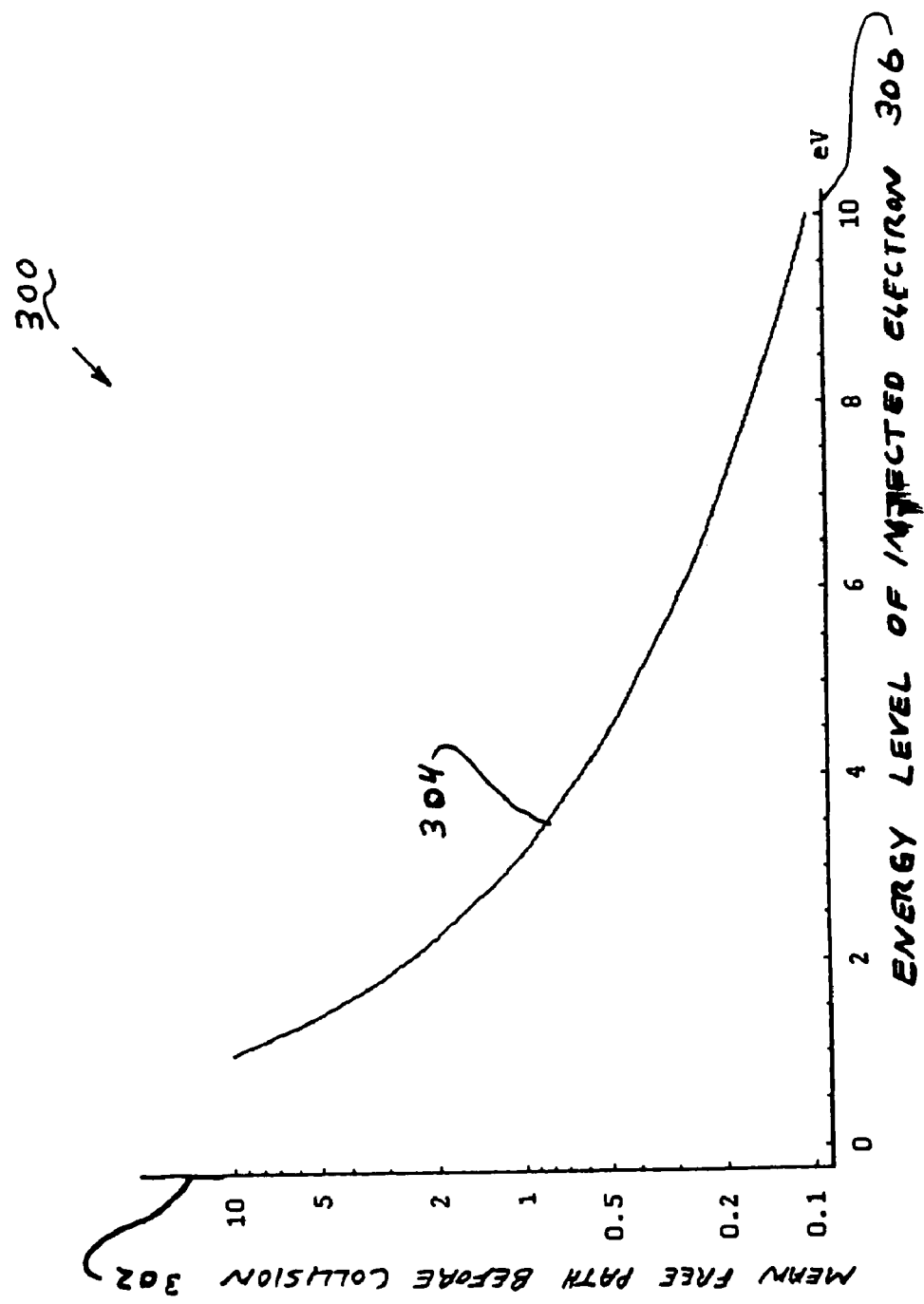
FIG. 3 is a plot of a mean-free-path of an injected-electron before collision with another electron as a function of energy level of the injected electron.

FIG. 3, is a plot of the distribution 304 of a mean free path of an electron before collision 302 with another electron as a function of energy level of the injected electron 306. From FIG. 3 it is observed that electrons injected at a high energy level travel a short distance before colliding with another electron. From the previous discussion of FIG. 2, the probability of collision is in favor of a collision between electrons of opposite spin polarization. Therefore, if the M-ESP of a material was parallel to the e2 polarization and e1-SP high-energy electrons were injected into the material, collisions would more readily occur with e2-SP low-energy electrons than with e1-SP low-energy electrons. The e2-SP electrons excited by the high-energy injected e1-SP electrons have much less energy than the 1 eV injection energy, on average. These excited e2-SP electrons will travel a large distance before suffering a collision with another electron (FIG. 3). This combination of scattering mechanisms constitutes a very efficient majority-spin pump for removing e2-SP electrons from the magnetic volume. It will be appreciated by those skilled in the art that the same result is achieved if the M-ESP of the material were parallel with the e1-ESP and high-energy e2-SP electrons were injected with the intent of flipping the M-ESP of the material from the e1-ESP to the e2-ESP.

Relaxation Time

In order to achieve reversal of the magnetic polarization of the magnetic material it is necessary to inject a sufficient quantity of anti-parallel spin-polarized (SP) electrons in a time interval smaller than the relaxation time of the material. A ferromagnetic material maintains its magnetic-polarization because to do so is consistent with the laws of thermodynamics and allows the material to maintain a state of minimum energy. As e1-SP electrons are injected into the material described previously, having e2 M-ESP, they will be opposing the dominant exchange energy that creates and sustains ferromagnetism. The newly injected e1-SP electrons will become thermally agitated and will be induced to flip their spin with the creation of magnons, phonons, and inelastically scattered electrons inside a magnetic lattice. A magnetic volume of material will tend to restore the status quo (e2-ESP, within the example arbitrarily chosen herein) within itself by relaxation.

To overcome relaxation, a sufficient amount of e1-SP electrons must be transferred to the magnetic volume within a time less than the time required to relax the e1-ESP to e2-ESP. The critical equation governing the parameters involved in determining spin-flip is shown in FIG. 4 at 402. With reference to FIG. 4, the rate of thermal relaxation for the magnetic volume may be determined by the methods of Electron Paramagnetic Resonance and related techniques as are known in the art. A reasonable spin-relaxation time 406 for typical materials such as permalloy, used for the magnetic storage layer, are on the order of 1 nanosecond (ns). A number of spins in a magnetic volume 404 may be calculated by assuming a magnetic bit size measuring 40 nanometers (nM) on a side, containing 3 monolayers of Iron (Fe) atoms. Fe has a concentration of $8.5 \times 10^{22}$ atoms/cm$^3$ and a nearest neighbor spacing of $2.48 \times 10^{-10}$ meters. Thus, each bit consists of $1.01 \times 10^5$ atoms, the value of 404 in FIG. 4. This implies that the magnetic bit is relaxing approximately $1 \times 10^{14}$ spins/sec. If a magnetic gain 412 were unity, an electron current 408 of 16 micro Amps (µA) would be required to flip the M-ESP of-the bit from e2-ESP to e1-ESP. An electron unit charge 410 has a value of $-1.602 \times 10^{-19}$ coulomb. Magnetic gain 412 lowers the required electron current 408 for a given spin-relaxation time 406.

Magnetic Gain

Figure 5:
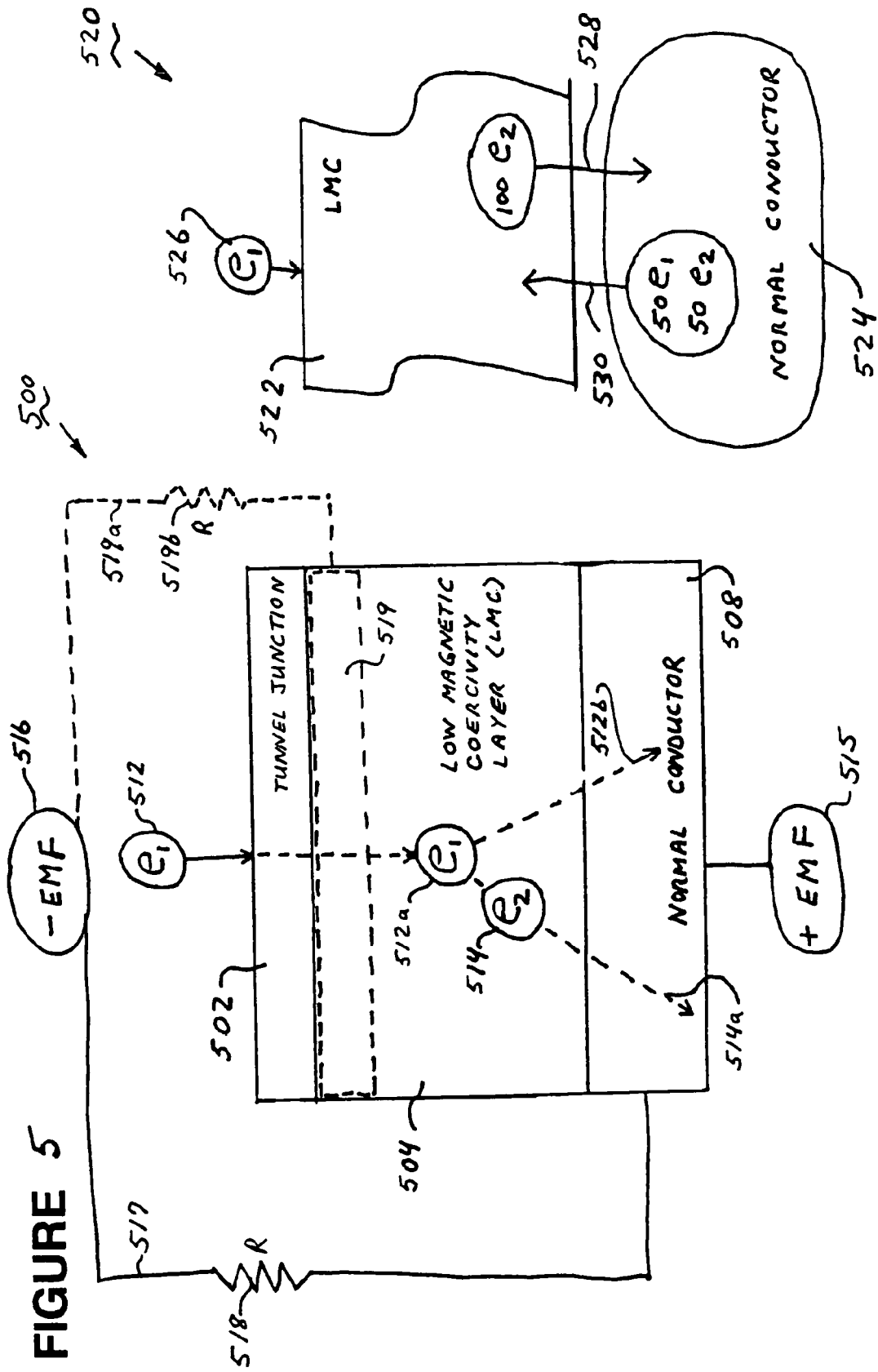
FIG. 5 is an illustration of magnetic gain using a tunnel junction.

Magnetic gain lowers the power required to reverse the magnetic polarization of a material for a given spin-relaxation time. Several sources of magnetic gain are available according to various embodiment of the invention. In one embodiment, magnetic gain is achieved by a relative difference between an energy level of an electron injection current and an energy level of the magnetic volume at equilibrium. FIG. 5 is an illustration of magnetic gain using a tunnel junction. With reference to FIG. 5, a low magnetic-coercivity layer of material is shown at 504. Low magnetic-coercivity (LMC) implies that the M-ESP of a material may be influenced and is less resistant to change than a material of high magnetic-coercivity. A non-exclusive list of materials that may be used for the LMC layer includes permalloy, nickel-cobalt-iron, iron-cobalt, and chromium dioxide. A non-exclusive list of materials that may be used for the HMC layer includes alnico, nickel-cobalt-iron, and nickel-cobalt. Consistent with the present example used herein, a M-ESP of 504 is parallel to the e2-ESP. Electrons at e1-ESP 512 are being injected across a tunnel junction (TJ) 502. TJ 502 has a property of an electrical insulator as well as performing a function of magnetically decoupling magnetic layer 504 and a second adjacent magnetic reference layer (not shown). The material used for TJ 502 may be selected for an appropriate atomic spacing to match the magnetic material in contact therewith. Materials such as aluminum oxide, titanium oxide or tungsten oxide may be used for TJ 502. The thickness of the TJ layer is subject to the details of the particular design, thicknesses of one to twenty angstroms (nM) are typical. However, the present invention is not limited thereby.

Electrons 512 may be raised to a potential of approximately one (1) electron volt (eV) by electromotive force 516 and 515, resistor 518 and path 517 across TJ 502. Resistor 518 is selected to have a value of several thousand ohms (Kohms) greater than the maximum tunnel junction resistance. An energy level within LMC 504 at equilibrium corresponds to thermal energy, which is approximately 25 milielectron volts (meV) at room temperature. Assuming equal energy transfer through the volume of 504, approximately one hundred (100) e2-SP electrons 514 should be driven out of LMC 504 by each injected high-energy e1-SP electron 512a. The e2-SP electrons driven out by collision with e1-SP electrons pass into normal conductor 508 along a plurality of possible trajectories, one such trajectory is shown at 514a. Some of the injected high-energy electrons 512a also pass out of LMC 504 along a plurality of trajectories; one such trajectory is shown at 512b.

As e2-SP electrons leave LMC 504 an induced electrostatic potential arises that causes a spin-balanced current to flow back into LMC 504 from normal conductor 508. Normal conductor 508 is non-magnetic, and has an equal amount of both e2-SP and e1-SP electrons as shown in 150 (FIG. 1B). Thus, the induced current flow from 508 to 504 is spin-balanced, meaning equal numbers of e2-SP and e1-SP electrons return to LMC 504. At equilibrium and charge balance, the non-magnetic metal, normal conductor 508, will have replaced on average each of two e2-SP electrons that left LMC 504 with one e2-SP and one e1-SP electron. The result will be a system gain of ½ of an e1-SP electron per e2-SP electron that was energized, leaving LMC 504. Integrating these changing spin populations over time leads to a steady growth of e1-SP over e2-SP electrons that eventually result in a reversal of the M-ESP of LMC 504. The reversed magnetic polarity of LMC 504 is parallel with the e1-SP.

The previously described effect is illustrated in FIG. 5 at 520. LMC is shown at 522 with e1-SP electrons being injected at 526. e2-SP electrons are driven off at 528 with the associated induced current flow of spin-balanced current 530 from normal conductor 524 to LMC 522. Thus, it is not detrimental that injected e1-SP electrons also leave LMC 504 as shown by path 512b since e1-SP electrons are replenished by the induced spin-balanced current flow 530. As previously mentioned, a magnetic gain of one hundred (100) is a reasonable estimate for 412 in FIG. 4, according to the magnetic gain mechanisms described herein which would result in lowering injection current 408 to approximately 100 nanoamps (nA) (FIG. 4).

In one embodiment, a normal conductor 519 (FIG. 5) may be placed between TJ 502 and LMC 504. Additionally in this embodiment, path 519a can be connected with resistor 519b back to the conductor 519. Path 517 and resistor 518 may be removed.

Magnetic-Mirror

Figure 6:
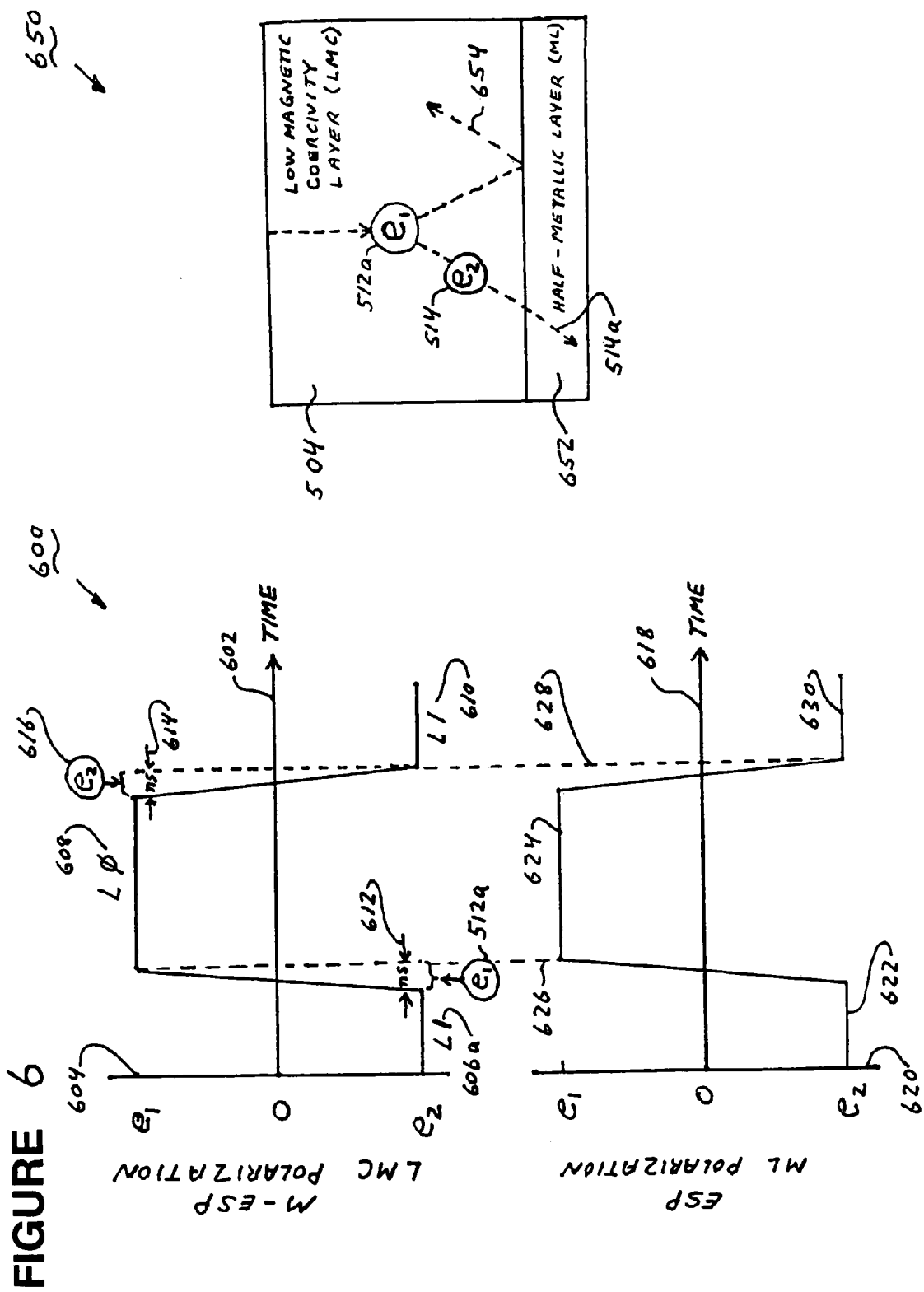
FIG. 6 illustrates a magnetic phase behavior of a magnetic storage layer and a half-metallic layer.

In several embodiments magnetic gain may be achieved by the use of a magnetic-mirror layer that acts as a mirror, reflecting incident opposite spin electrons, while allowing same spin electrons to pass through. In one embodiment, FIG. 6 illustrates the magnetic phase behavior of the magnetic storage layer and a half-metallic layer. In one embodiment, the magnetic-mirror may be a half-metallic layer. With reference to FIG. 6, half-metallic layer (ML) 652 is disposed beneath the LMC layer 504. A non-exclusive list of material that the half-metallic layer may be made from includes chromium dioxide, titanium dioxide, or rubidium dioxide. The thickness of the half-metallic layer is often in the nanometer range, typically less than 10 nanometers and is based on the material chosen. Returning to the discussion of flipping the M-ESP of the LMC layer 504, injected high-energy e1-SP electrons enter 504, as shown at 512a colliding with opposite spin e2-SP electrons 514 that are scattered. The scattered e2-SP 514 electrons follow a plurality of paths subsequent to scattering. One such path is shown at 514a, where a scattered e2-SP electron passes through the ML layer 652. The ML layer has energy distributions with respect to each electron-spin-polarization (ESP) as shown in 175 (FIG. 1B). With reference to FIG. 1B, since only the e2-SP energy states 178 reach the Fermi level 184, ML 652 will be receptive to e2-SP electrons. The e1-SP energy states 176 do not reach the Fermi level 178, therefore e1-SP electrons are reflected off of the ML layer. The ML layer acts like a magnetic insulator to e1-SP electrons when its present ESP is parallel to LMC 504 (e2-ESP). Thus, the half-metallic layer causes e1-SP electrons to accumulate within the LMC 504 layer, which aids reversal of the magnetic polarization (M-ESP) of the LMC 504 layer.

With reference back to FIG. 6, the M-ESP of LMC 504 and the ESP of ML 652 are shown at 600 for one cycle of flipping the magnetic polarity from e2-SP to e1-SP and then back to e2-SP. Injected high-energy e1-SP electrons 512a, previously described, are injected for approximately a nanosecond 612 causing the M-ESP of LMC 504 to flip from e2-SP at 606a to e1-SP at 608. The M-ESP of the LMC and ML layers remain in phase with each other as illustrated at 628. Time is plotted for the LMC layer at 602 and is plotted similarly for the ML layer at 618. There is a very small delay (not shown) in the response of the ML layer, which is on the order of less than a picosecond ($1\times10^{-12}$ seconds). It should be noted that the orientation of the energy states shown in FIG. 1B at 175 corresponds to the ESP of the ML at 622 and 630 in FIG. 6. During ESP 624, the energy distributions shown at 175 in FIG. 1B would be mirrored with respect to the zero of the wavenumber axis 180, where e1-SP states would reach the Fermi level 184 and e2-SP states would not be filled to the Fermi level (not shown). Thus, the ML 652 layer's ESP is dominated by the M-ESP of LMC 504 and acts as a magnetic-mirror which flips ESP with the flip of the M-ESP of LMC 504.

To flip the M-ESP of the LMC 504 layer back to e2-ESP, e2-SP high-energy electrons 616 are injected for approximately a nanosecond at 614 causing the M-ESP of the LMC layer to reverse from e1-ESP at 608 to e2-ESP at 610. The ML layer flips ESP from e1-ESP at 624 to e2-ESP at 630, following the LMC layer as previously described.

The two magnetic polarities may be used as memory states corresponding to "0" and "1." M-ESP e2 has been arbitrarily assigned to memory state "1" and M-ESP e1 has been arbitrarily assigned to memory state "0." It will be noted by those skilled in the art the opposite assignment of memory states with M-ESP could have been made. The invention is not limited by the assignment chosen.

Highly Polarized Weakly Coupled Magnetic Layer

Figure 7:
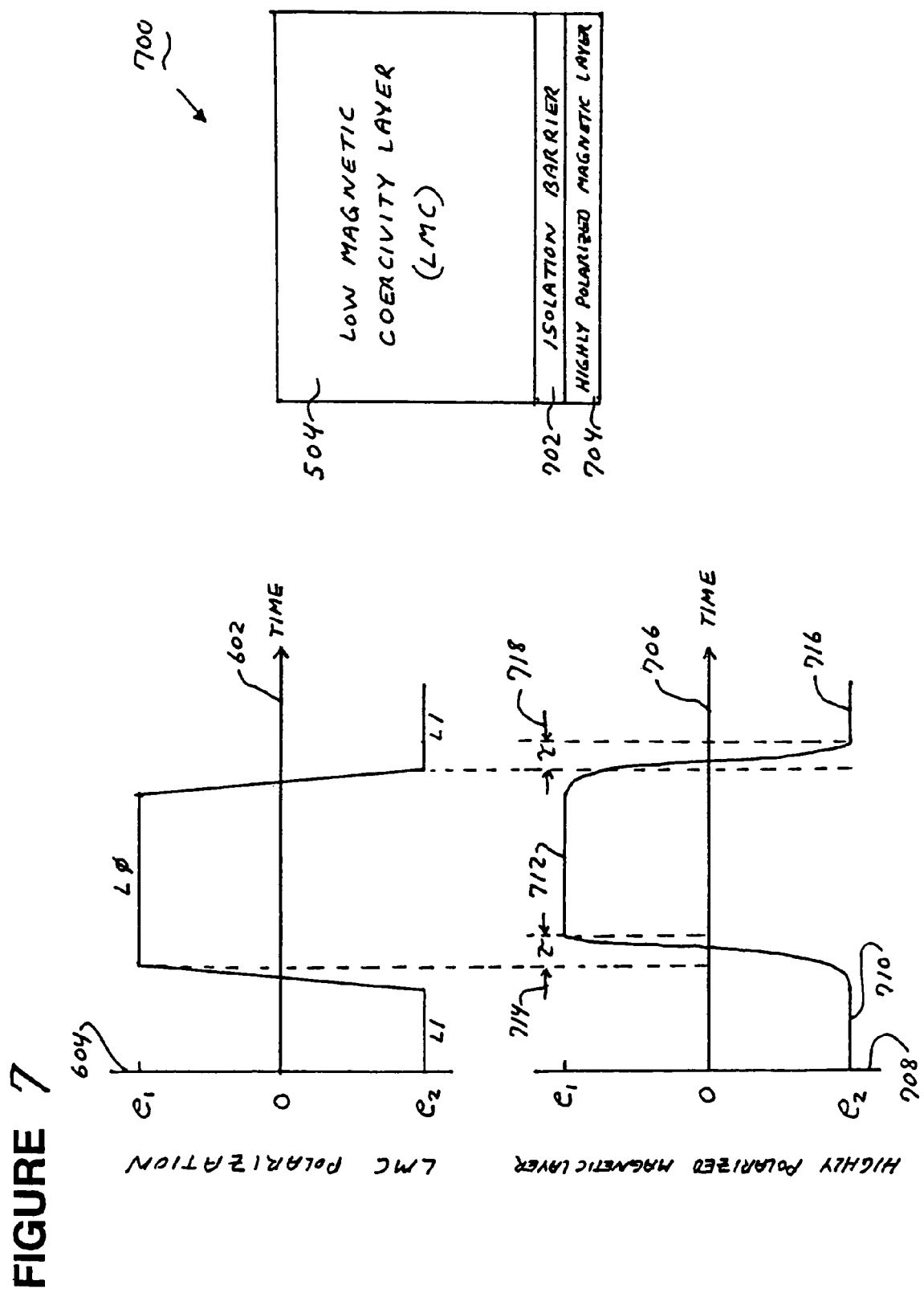
FIG. 7 illustrates a phase behavior between a storage layer and a highly polarized weakly coupled magnetic layer.

According to another embodiment, a magnetic-mirror may be made using an isolation barrier and highly polarized magnetic layer to provide reflection of injected high-energy electrons. An isolation barrier can be made from a normal conductor such as copper. With reference to FIG. 7, the phase behavior between the LMC 504 layer and a highly polarized weakly coupled magnetic layer is illustrated. LMC 504 layer is shown in contact with isolation barrier (IB) 702 and highly polarized weakly coupled magnetic layer (HPML) 704. The M-ESP of the HPML 704 layer is dominated by the M-ESP of the LMC 504 layer. The HPML layer's response follows the polarization reversal of the LMC 504 layer. However, the HPML response is delayed in time by time delay 714 as transition from e2-ESP to e1-ESP occurs and time delay 718 as transition from e1-ESP to e2-ESP occurs.

In FIG. 7, LMC M-ESP 604 plotted with time 602 is the same as shown in FIG. 6. HPML M-ESP state 708 is plotted with time 706. The HPML M-ESP state at 710 corresponds with the ML ESP at 622 (FIG. 6), the HPML M-ESP at 712 corresponds with the ML ESP at 624 (FIG. 6), and the HPML M-ESP at 716 corresponds with the ML ESP at 630 (FIG. 6).

Magnetic Cell Impedance

Figure 8:
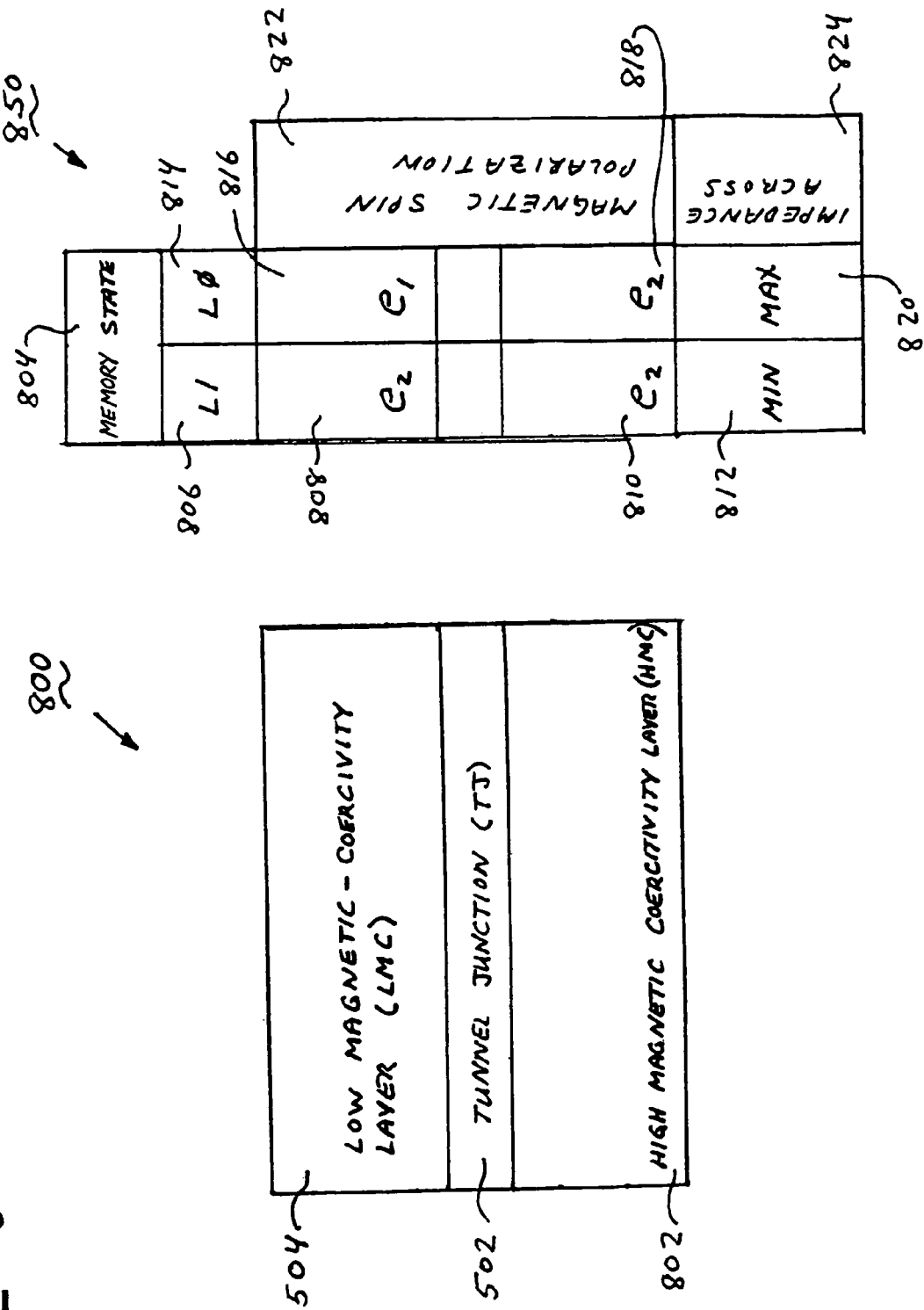
FIG. 8 illustrates a majority electron-spin-polarization of a low magnetic-coercivity layer (LMC) storage layer and a high magnetic-coercivity layer (HMC) reference layer for two different memory states of a typical memory cell.

The present invention may be configured, according to several embodiments, with a reference layer of high magnetic-coercivity material that does not change magnetic orientation (the M-ESP of the material) as the LMC layer experiences reversal of its M-ESP. A high magnetic-coercivity layer may be used as a reference to facilitate "reading" the data stored in the LMC layer, where the "data" is the M-ESP state of the LMC layer, e.g., e2-ESP or e1-ESP. FIG. 8 illustrates the M-ESP of a LMC layer and a high magnetic-coercivity layer (HMC) for two different memory states of a typical memory cell. With reference to FIG. 8, a basic three-layer stack is illustrated at 800 for the memory cell. The stack includes LMC layer 504, tunnel junction (TJ) 502 and a high magnetic-coercivity layer (HMC) 802. The M-ESP of HMC 802 is usually fixed or pinned with a known magnetic orientation and does not change during operation of the memory cell 800. The M-ESP of HMC 802 may be fixed at e2-ESP or e1-ESP, the choice is arbitrary and does not limit the invention.

The HMC layer 802 is typically applied to a substrate when a magnetic memory cell is constructed, therefore the HMC layer 802 is illustrated in FIG. 8 on the bottom of the stack 800, a substrate would be located beneath the HMC layer 802. The TJ 502 is disposed in between the LMC 504 layer and the HMC 802 layer, which places the TJ 502 beneath the LMC 504 layer. The portion of the magnetic memory cell shown in 800 is meant to illustrate storing and "reading" the data stored in the LMC 504 layer.

Two memory states are shown in table 850 for the memory cell 800. Memory state L1 at 806 occurs when the M-ESP of LMC 504 is at e2-ESP, illustrated by 808 and the M-ESP of HMC 802 is at e2-ESP, illustrated by 810. The impedance is measured across the three-layer stack and is at a minimum for memory state L1. Memory state L1 occurs when the M-ESPs of the layers are parallel. A maximum impedance will be measured across the stack when the impedance of LMC 504 layer is at e1-ESP (816), corresponding to a second memory state L0 at 814. This condition places the M-ESPs of LMC 504 and HMC 802 anti-parallel. The difference in impedance so measured provides a signal by which the magnetic-polarization state of the device maybe measured and thereby related to one of the two logic states.

Use of a three-layer stack as shown in FIG. 8 provides a change in impedance of approximately 30% between the two magnetic-polarization states. As was previously discussed, the present giant magneto-resistance (GMR) memory cells provide a change in impedance of approximately 3–10%. Thus, the present invention increases the signal level by a factor of 3 to 10. For a given signal-to-noise requirement, this increase in signal level is proportional to a permissible reduction in volume of the memory cell, which will provide a corresponding increase in memory density.

Alternative Energy-Gap

Figure 8B:
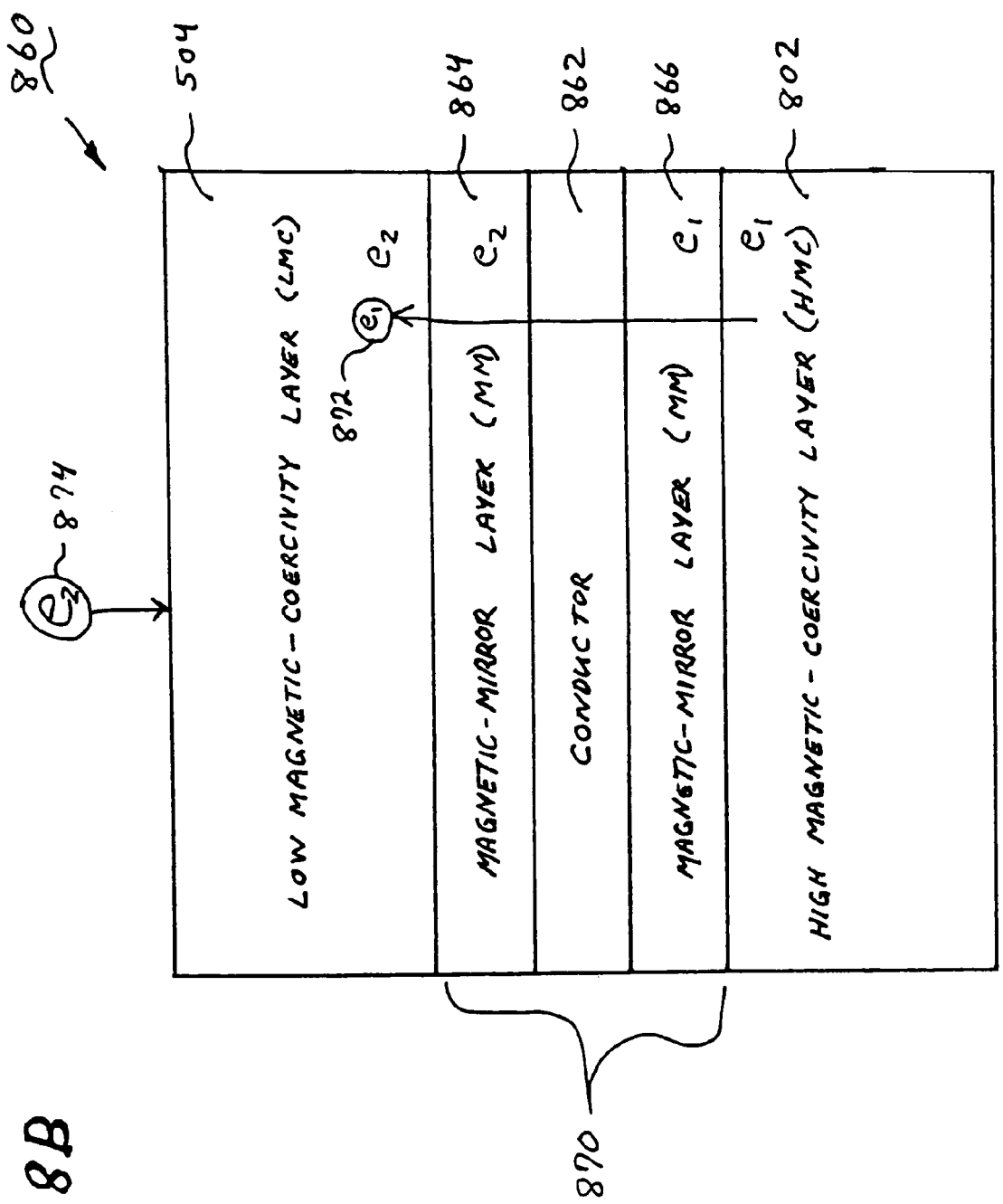
FIG. 8B illustrates a dual magnetic-mirror/conductor junction.

In an alternative embodiment of the present invention, an alternative energy-gap to the tunnel junction is used to increase the change in impedance across the memory cell illustrated in FIG. 8B, which will lead to further increases in memory density as previously discussed. In addition, high-energy electrons may be injected via the alternative energy-gap into the magnetic storage layer to reverse the M-ESP of the magnetic storage layer.

With reference to. FIG. 8B, a stack 860 includes the LMC 504 layer in contact with and magnetically coupled to the first magnetic-mirror (MM) layer at 864. The first MM 864 layer is in contact with a normal conductor 862. The normal conductor 862 is in contact with a second MM layer at 866 and the MM 866 layer is in contact with the HMC 802 layer. In one embodiment, the magnetic-mirrors 864 and 866 may be half-metallic layers as previously described in conjunction with FIG. 6. An alternative energy-gap 870 includes MM 864, normal conductor 862 and MM 866.

When the M-ESPs of the LMC 504 layer and the HMC 802 layer are parallel the impedance between them drops to the conducting impedance of the magnetic materials and the stack. When the M-ESPs of the LMC 504 layer and the HMC 802 layers are anti-parallel, the impedance of the stack increases significantly due to the close coupling of each MM layer with its adjacent magnetic layer, e.g., 866 with 802 and 864 with 504. Thus, each MM is aligned to the anti-aligned magnetic layers and the electrons from each MM are of opposite ESP and the opposing MM resists the current flow. The aligned impedance is very low relative to the anti-aligned impedance resulting in an increased change in impedance between the two states.

High-energy spin-polarized electrons can be injected via the alternative energy-gap 870. Electrons within HMC 802 may be raised to a potential of approximately one (1) electron volt (eV) by electromotive forces as described in conjunction with FIG. 5, thereby causing high-energy e1-SP electrons to jump across energy-gap 870 as shown at 872 and be injected into the LMC 504 layer. Magnetic polarization reversal will follow as previously described causing the M-ESP of the LMC to reverse from e1 to e2. A subsequent reversal of the M-ESP of the LMC 504 may be accomplished by injecting high-energy e2-SP electrons as shown at 874. High-energy e2-SP electrons 874 may be injected by duplicating energy-gap 870 and another high magnetic coercivity layer of e2 M-ESP located above the LMC layer 504 (not shown). Alternatively, high-energy e2-SP electrons 874 could be generated by the tunnel junction and another high magnetic coercivity layer of e2 M-ESP material located above the LMC layer 504 (not shown). The high-energy e2-SP electrons may be introduced according to the previous discussion directed thereto, or by any other means. The present invention is not limited thereby.

Memory Cells

Figure 9:
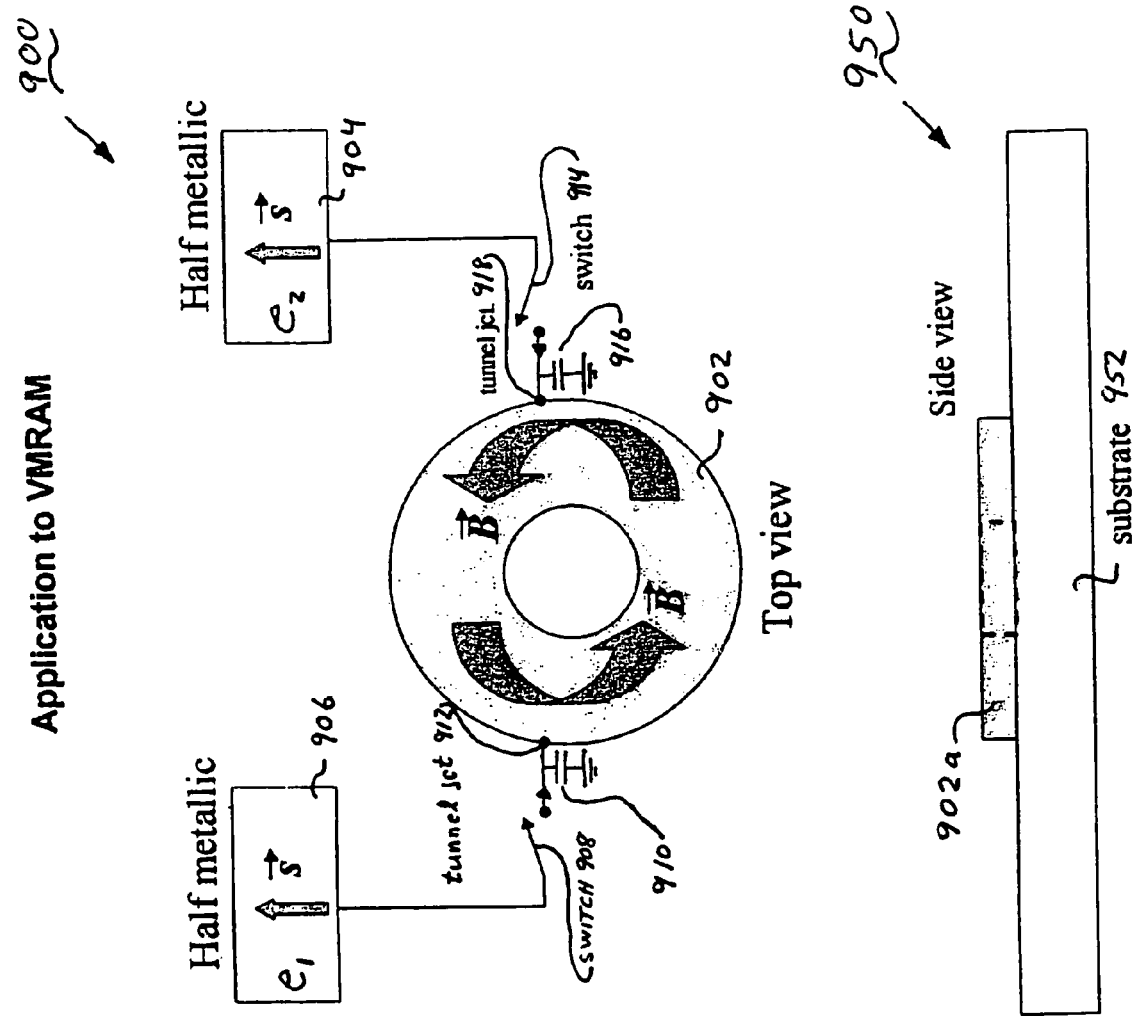
FIG. 9 depicts a schematic representation of a vertical magnetic random access memory (VMRAM) memory cell.

The present invention may be-applied to a variety of memory cells. One such memory cell is illustrated in FIG. 9 as a vertical magnetic random access memory (VMRAM) cell. A top view of the VMRAM cell is shown in 900. In one embodiment, two sources of spin-polarized (SP) electrons are provided by half-metallic layers (ML) 906 and 904. Several methods may be used, that are well known in the art, to produce a source of spin-polarized electrons. For example, a ML layer coupled with a high coercivity magnetic-layer will create close to a 100% polarization for electrons inside of it. Alternatively, an anti-ferromagnetic layer next to a ML layer may be used. Source 906 contains e1-SP electrons and source 904 contains e2-SP electrons. A VMRAM cell 902 contains a LMC storage layer as previously described. Switch 908 may be used to direct e1-SP electrons from source 906 into tunnel junction 912 to place the cell in one logic state. Similarly, switch 908 may be opened and switch 914 may be closed to flip the M-ESP of the LMC layer within 902 by injecting e2-SP electrons into tunnel junction 918. For illustrative purposes capacitor 910 is used to represent the electrical property of the tunnel junction 912. The same illustration for the electrical property of the tunnel junction is provided by capacitor 916. Alternatively, the same injection point could be used for both sources of SP electrons; the invention is not limited by the number of injection points so arranged.

A side view 902a of the VMRAM cell is shown in 950. A substrate 952 is shown underneath 902a. The present invention is readily implemented with semiconductor manufacturing processes that are well known in the art. An array of memory elements may be constructed on a monolithic chip incorporating the teachings of the present invention to create an array of magnetic memory cells.

The memory cell may be fashioned into round or square shapes. A round doughnut-shape is shown in FIG. 9. The doughnut shape of the VMRAM cell directs the trapped magnetic flux into a circular magnetic domain. This avoids an out-of-plane magnetization in the center of the circular bit region. 1's and 0's are encoded according to the rotational sense of the magnetization. An advantage of a round shape is that the magnetic orientation is in plane and does not present an out of plane singularity. A square shape will produce one or more out of plane singularities within the magnetic field, which may be undesirable or unstable. In one embodiment, the direction of the magnetic field can be controlled by pre-stressing the magnetic layer. Pre-stressing the magnetic layer can cause the orientation of the magnetic field to become out of plane, even for square shaped layers.

Figure 10:
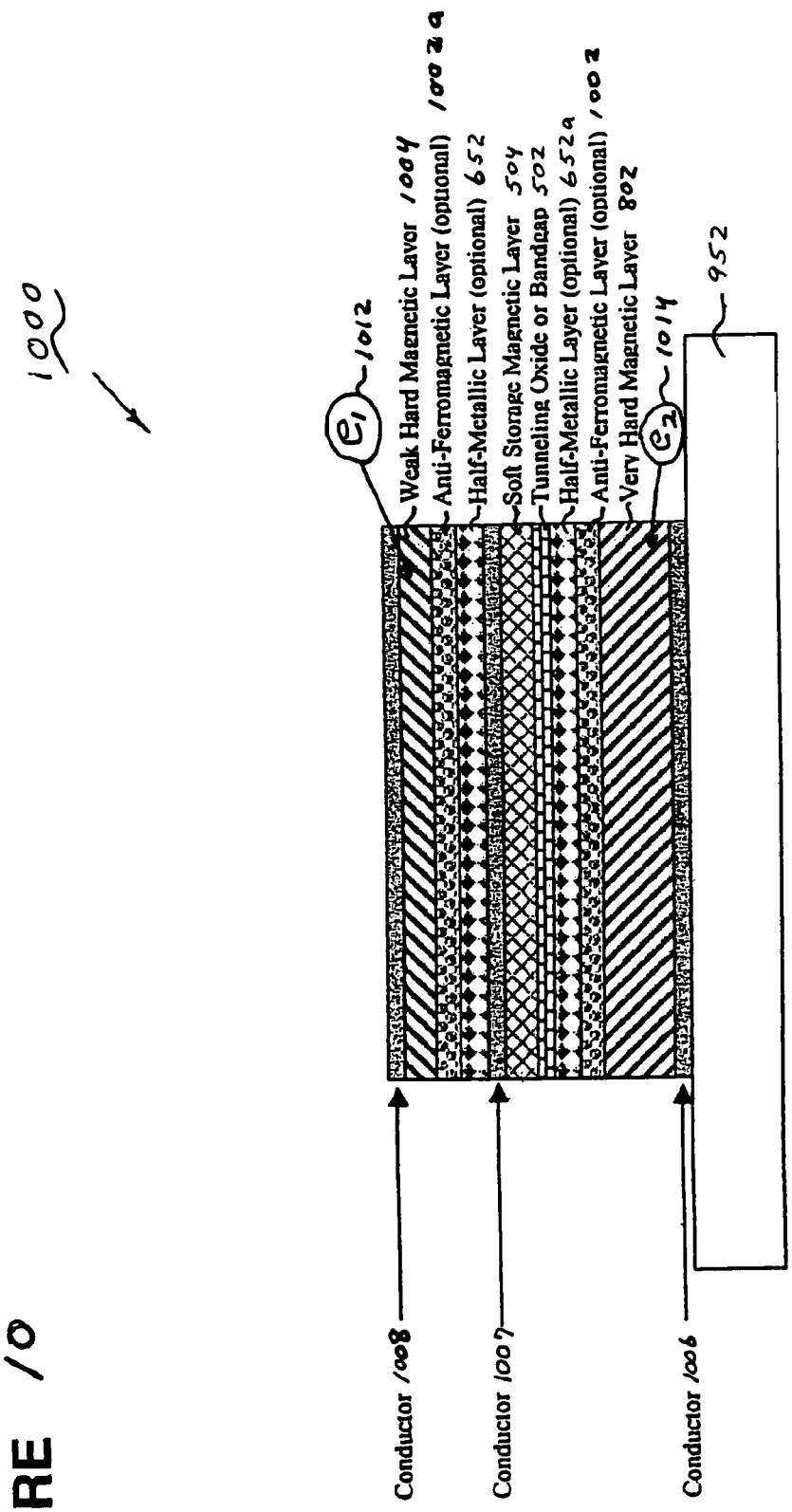
FIG. 10 illustrates a cross sectional view of a vertical magnetic random access memory (VMRAM) memory cell.

FIG. 10 illustrates a cross-sectional view of a vertical magnetic random access memory (VMRAM) memory cell 1000. The cell 1000 may be circular or rectangular as previously discussed, but for simplicity, this description will be based on rectangular cells. A conductor 1006 is a lower contact to the memory cell 1000. A conductor 1007 is attached to the top of the LMC layer 504. A Conductor 1008 is provided as a current source for forcing a change to the LMC 504 layer. If the M-ESPs of the HMC 802 layer and the LMC 504 layers are aligned, same magnetic orientation either vertical or in plane, then the impedance through the tunnel junction 502 will be at a minimum (one memory state). If the M-ESPs of the HMC 802 layer and the LMC 504 layers are anti-aligned, then the impedance through the tunnel junction 502 will be at a maximum.

The half-metallic layers 652 and 652a and anti-ferromagnetic layers 1002 and 1002a are optional and provide enhanced spin-polarization and spin-mirroring as previously described. The anti-ferromagnetic layers 1002 and 1002*a* and the half-metallic layers 652 and 652*a* may be used as desired to enhance the spin-polarization performance of the memory cell and correspondingly the design of the memory cell 1000.

In one embodiment, the HMC 802 layer is magnetized (setting the M-ESP) during manufacturing to a reference spin orientation, either e2-ESP or e1-ESP. The weak hard magnetic layer 1004 is programmed to the opposite ESP of the HMC 802 layer. The order of these is not essential, but in the preferred embodiment the HMC 802 layer is programmed first by a strong external magnetic field since the field strength required to program this is the stronger of the two. The weak hard magnetic layer 1004 is programmed anti-parallel to the HMC 802 layer by a weaker external magnetic field that will not alter the current state of the HMC 802 layer. The relative magnetic moments of these two layers can be reversed without changing the basic behavior of the cells, nor is there limitation placed on the invention, thereby.

To reset the M-ESP of the LMC 504 layer to be parallel with the M-ESP of the HMC 802 layer, an electron flow is introduced from the conductor 1006 to the conductor 1008. To set the soft storage magnetic layer 504 to be anti-parallel with the M-ESP of the HMC 802 layer, an electron flow is introduced from the conductor 1008 to the conductor 1006. The reversal of the M-ESP of the LMC 504 layer is caused by the mechanisms articulated above including the gain mechanisms associated with the magnetic-mirror, the half-metallic, and anti-ferromagnetic layers.

The impedance of the cell 1000 is sensed between the conductor 1007 and the conductor 1006. The conductor 1008 is used during the cell writing operations and is in a high impedance state relative to the conductor 1007 during cell sensing.

Thus, a novel method and apparatus for reversing the electron-spin-polarization within a material is described. Although the invention is described herein with reference to specific preferred embodiments, many modifications therein will readily occur to those of ordinary skill in the art. Accordingly, all such variations and modifications are included within the intended scope of the invention as defined by the following claims.

What is claimed is:

1. A method comprising:
    polarizing a high magnetic-coercivity layer of material (HMC layer) with a first majority electron-spin-polarization (M-ESP);
    depositing an energy-gap layer on the HMC layer; and
    depositing a low magnetic-coercivity layer of material (LMC layer) on the energy-gap layer.

2. The method of claim 1, wherein said energy-gap is a tunnel junction layer of material (TJ layer).

3. The method of claim 2, wherein said TJ layer is aluminum oxide.

4. The method of claim 1, wherein said energy-gap is a normal conductor disposed between a first magnetic mirror and a second magnetic mirror.

5. The method of claim 1, further comprising depositing a non-magnetic material in electrical communication with said LMC layer.

6. The method of claim 1, wherein said HMC layer is alnico.

7. The method of claim 1, wherein said LMC layer is permalloy.

8. The method of claim 1, further comprising depositing a magnetic-mirror layer of material (MM).

9. The method of claim 8, wherein said MM is a half-metallic.

10. The method of claim 9, wherein said half-metallic is aluminum oxide.

11. The method of claim 8, further comprising:
    depositing an isolation barrier layer of material (IB layer); and
    depositing a highly polarized magnetic layer of material coupled with said IB layer.

12. The method of claim 8, wherein said HMC layer is alnico.

13. The method of claim 8, further comprising depositing an anti-ferromagnetic layer of material.

14. An apparatus, comprising:
    a polarized high magnetic-coercivity layer of material (HMC layer) with a first majority electron-spin-polarization (M-ESP);
    a low magnetic-coercivity layer of material (LMC layer); and
    an energy-gap layer positioned between the HMC layer and the LMC layer.

15. The apparatus of claim 14, wherein said energy-gap is a tunnel junction layer of material (TJ layer).

16. The apparatus of claim 15, wherein said TJ layer is aluminum oxide.

17. The apparatus of claim 14, wherein said energy-gap is a normal conductor disposed between a first magnetic mirror and a second magnetic mirror.

18. The apparatus of claim 14, further comprising a non-magnetic material in electrical communication with said LMC layer.

19. The apparatus of claim 14, further comprising a magnetic-mirror layer of material (MM) positioned between the HMC layer and the LMC layer.

20. The apparatus of claim 19, further comprising:
    an isolation barrier layer of material (IB layer); and
    a highly polarized magnetic layer of material coupled with said IB layer.

21. The apparatus of claim 19, further comprising an anti-ferromagnetic layer of material.

22. A system, comprising:
    a processor; and
    a magnetic random access memory (MRAM) coupled with the processor, the MRAM comprising:
        a polarized high magnetic-coercivity layer of material (HMC layer) with a first majority electron-spin-polarization (M-ESP);
        a low magnetic-coercivity layer of material (LMC layer); and
        an energy-gap layer positioned between the HMC layer and the LMC layer.

23. The system of claim 22, further comprising:
    an MRAM controller coupled with the processor and the MRAM, wherein the MRAM controller is configured to store data in the MRAM and to read data from the MRAM.

24. The system of claim 23, further comprising:
    a system bus coupled with the processor; and
    a display coupled with the system bus.

25. The system of claim 22, wherein said energy-gap is a tunnel junction layer of material (TJ layer).

26. The system of claim 25, wherein said TJ layer is aluminum oxide.

27. The system of claim 22, wherein said energy-gap is a normal conductor disposed between a first magnetic mirror and a second magnetic mirror.

28. The system of claim 22, further comprising a non-magnetic material in electrical communication with said LMC layer.

29. The system of claim 22, further comprising a magnetic-mirror layer of material (MM) positioned between the HMC layer and the LMC layer.

30. The system of claim 29, further comprising:

an isolation barrier layer of material (IB layer); and a highly polarized magnetic layer of material coupled with said IB layer.

31. The system of claim 29, further comprising an anti-ferromagnetic layer of material.

* * * * *